(12) United States Patent
Freund et al.

(10) Patent No.: US 6,306,670 B1
(45) Date of Patent: Oct. 23, 2001

(54) TOOL FOR HANDLING A WORKPIECE

(75) Inventors: Joseph Michael Freund, Fogelsville; George John Przybylek, Douglasville; Dennis Mark Romero, Allentown; John W. Stayt, Schnecksville, all of PA (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 09/373,354

(22) Filed: Aug. 12, 1999

(51) Int. Cl.[7] .................................................. H01L 21/66
(52) U.S. Cl. .............................. 438/14; 414/816; 414/755; 414/783; 356/426

(56) References Cited

U.S. PATENT DOCUMENTS

| | | | |
|---|---|---|---|
| 4,818,169 | * | 4/1989 | Schram et al. ........................ 414/331 |
| 5,547,515 | * | 8/1996 | Kudo et al. ............................ 134/21 |
| 5,592,295 | * | 1/1997 | Stanton et al. ........................ 356/426 |
| 6,029,427 | * | 2/2000 | Freund et al. ........................ 53/471 |
| 6,045,321 | * | 4/2000 | Freund et al. ........................ 414/783 |
| 6,074,164 | * | 6/2000 | Spencer et al. ....................... 414/816 |
| 6,109,861 | * | 8/2000 | Freund et al. ........................ 414/755 |

* cited by examiner

Primary Examiner—John F. Niebling
Assistant Examiner—Olivia Luk
(74) Attorney, Agent, or Firm—Dickstein Shapiro Morin & Oshinsky LLP

(57) ABSTRACT

A system for flipping a semiconductor workpiece on its thin edge for microscope inspection of a workpiece facet is disclosed. The system has a holding device attached to a handling block. The holding device picks a workpiece by one of its thin edges. The edge of the workpiece may be attached to the holding device by vacuum. Then an operator rotates the handling block ninety degrees, which in turn rotates the holding device and workpiece ninety degrees. After rotation, one of the workpiece facets faces upward and perpendicular to the microscope for proper inspection of the facet.

5 Claims, 4 Drawing Sheets

TOOL FOR HANDLING A WORKPIECE

BACKGROUND OF THE INVENTION

I. Field of the Invention

The present invention relates generally to manufacturing systems where workpieces are inspected to ensure quality in the manufacturing process. More specifically, the invention relates to an apparatus and method for facilitating the inspection of the facets of a semiconductor workpiece under a microscope.

II. Description of the Related Art

In the manufacture and assembly of semiconductor products, relatively small parts or components are routinely examined to ensure quality in the manufacturing process. In particular, the visual examination of the facets of a laser chip or bar is a necessary step to ensure proper operation of the laser. To this end such semiconductor workpiece facets are inspected under a microscope during the manufacturing process. For proper inspection, the workpiece must stand on a thin edge, a facet, so as to align a facet on the other side of the workpiece to be perpendicular to the downward looking microscope. The act of standing the workpiece on its edge is tedious and time consuming. Current practice is to manually flip a workpiece on edge using a razor blade, a sharp pointed awl, tweezers or a combination of these tools. Some have even placed adhesive tape on the wide side of the workpiece and then attempted to flip the workpiece by gripping the excess tape on both sides of the workpiece. These manual operations typically take an inordinate amount of time and skill. Furthermore, once the workpiece is sitting on its edge, the workpiece may still fall back to its original position. These handling techniques may damage the workpiece. The workpiece may be a chip, a bar, a wafer, etc. This manual perpendicular alignment is performed at an angle and by human eye, thus making the process cumbersome, potentially inaccurate and unrepeatable.

There exists a need for a system that provides precise, repeatable and efficient alignment between a workpiece facet and a microscope to allow for proper inspection of the facet.

SUMMARY OF THE INVENTION

The present invention relates to a system for handling a semiconductor workpiece, such as a semiconductor chip, laser bar, wafer and the like. The system includes an apparatus used to pick and hold a workpiece and allow it to be rotated ninety degrees such that a facet of the workpiece is perpendicular to a microscope used for inspection.

According to one aspect of the invention, a holding device, featuring an aperture and conduit to a vacuum source, is provided to pick and hold the workpiece by one of its facets (thin edge). At this point all facets are parallel to an axis of an inspection microscope. Thereafter, an operator manually flips a handling block, attached to the holding device, onto an adjacent side which sits ninety degrees from the handling block's initial sitting position. This, in turn, also rotates the holding device and workpiece ninety degrees such that one of the workpiece facets is now perpendicular to the microscope axis, where perpendicularity facilitates proper inspection. After inspection the workpiece may be flipped back to initial position, by using the handling block, released and picked from a different side to examine another facet on the workpiece. Thus, the system provides for a precise, repeatable and efficient alignment between a workpiece facet and a microscope to allow for proper inspection of the facet. Furthermore, the system requires no special manual dexterity.

In a preferred embodiment of the invention, the apparatus includes a rigid cube, as the handling block, with an attached vacuum arm, as the holding device. The present invention should not be limited, however, to the preferred embodiments described and shown in detail herein.

BRIEF DESCRIPTION OF THE DRAWINGS

The foregoing and other advantages and features of the invention will become more apparent from the detailed description of preferred embodiments of the invention given below with reference to the accompanying drawings in which.

DETAILED DESCRIPTION OF PREFERRED EMBODIMENTS

Figure 1:
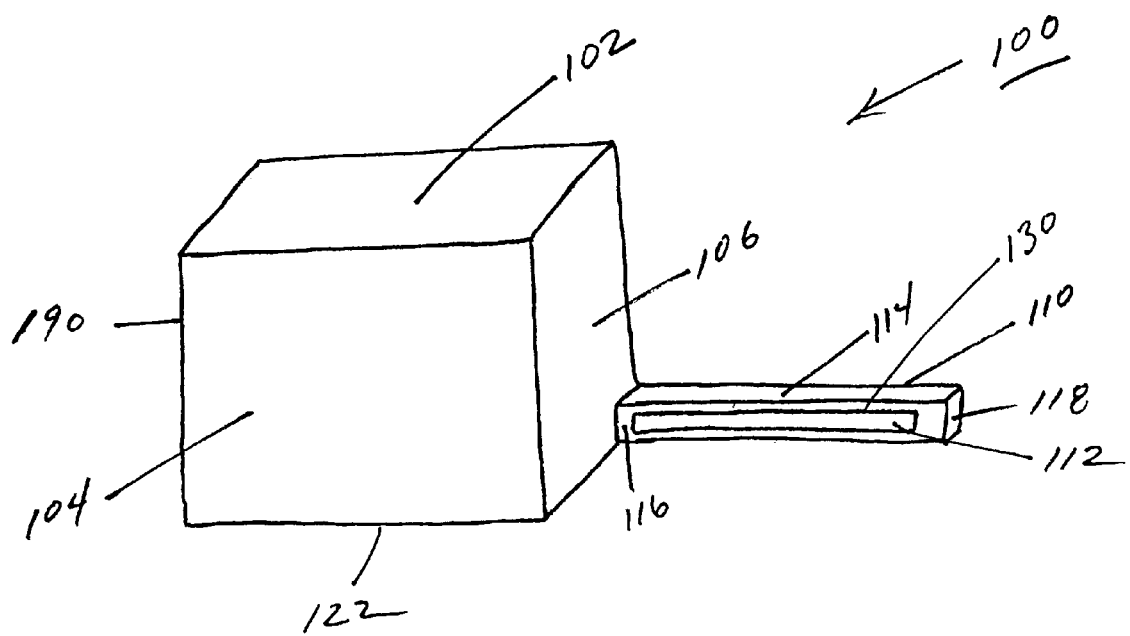
FIG. 1 is a perspective view of an alignment system constructed in accordance with a preferred embodiment of the present invention.

Referring now to the drawings, where like reference numerals designate like elements, there is shown in FIG. 1 a system 100 for aligning a workpiece facet to a microscope. The system 100 includes a handling block 190 and a holding device 110 attached thereto. Although the handling block 190 has six sides, only four sides 102, 104, 106, 122 can be seen in the drawings. At least two sides of the handling block 190 are control surfaces, meaning that such sides are manually used to rotate the handling block 190. In this embodiment the control surfaces are handling block sides 122 and 104. The holding device 110 also has six sides of which four sides 114, 116, 118, 120 can be seen in the drawings. The holding device 110 is attached to the handling block 190 on handling block side 106, with holding device side 114 and handling block side 102 facing up. The handling block 190 and the holding device 110 may be formed as rectangles with edges forming ninety degree angles. As shown in FIG. 1, the holding device 110 is attached to the handling block 190 such that the bottom surface of the handling block 190 and the bottom surface of the holding device 110 are in the same plane.

Figure 3:
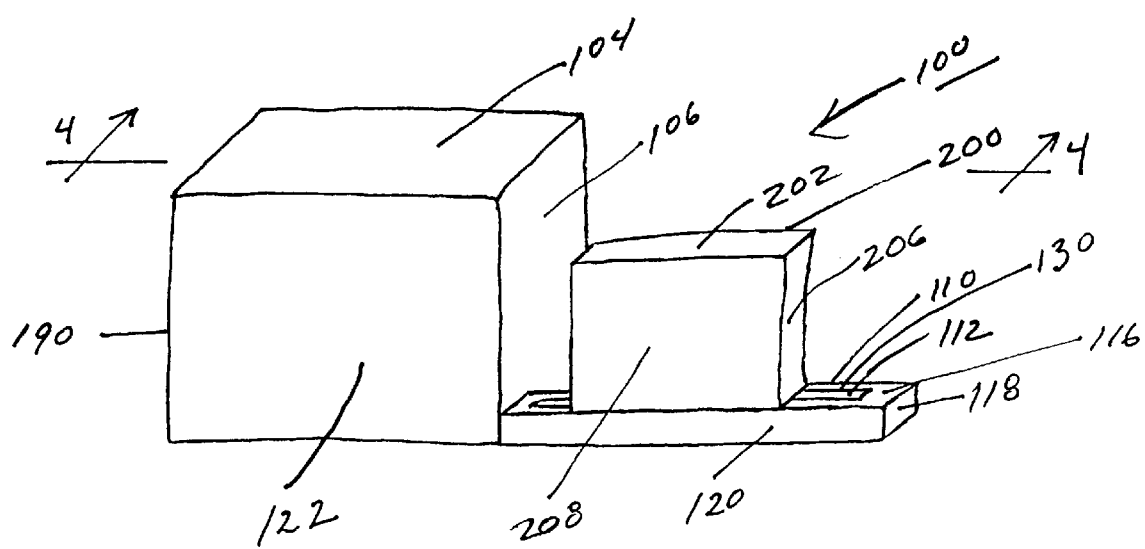
FIG. 3 is a perspective view of the system of FIG. 1, at another stage of use.
Figure 4:
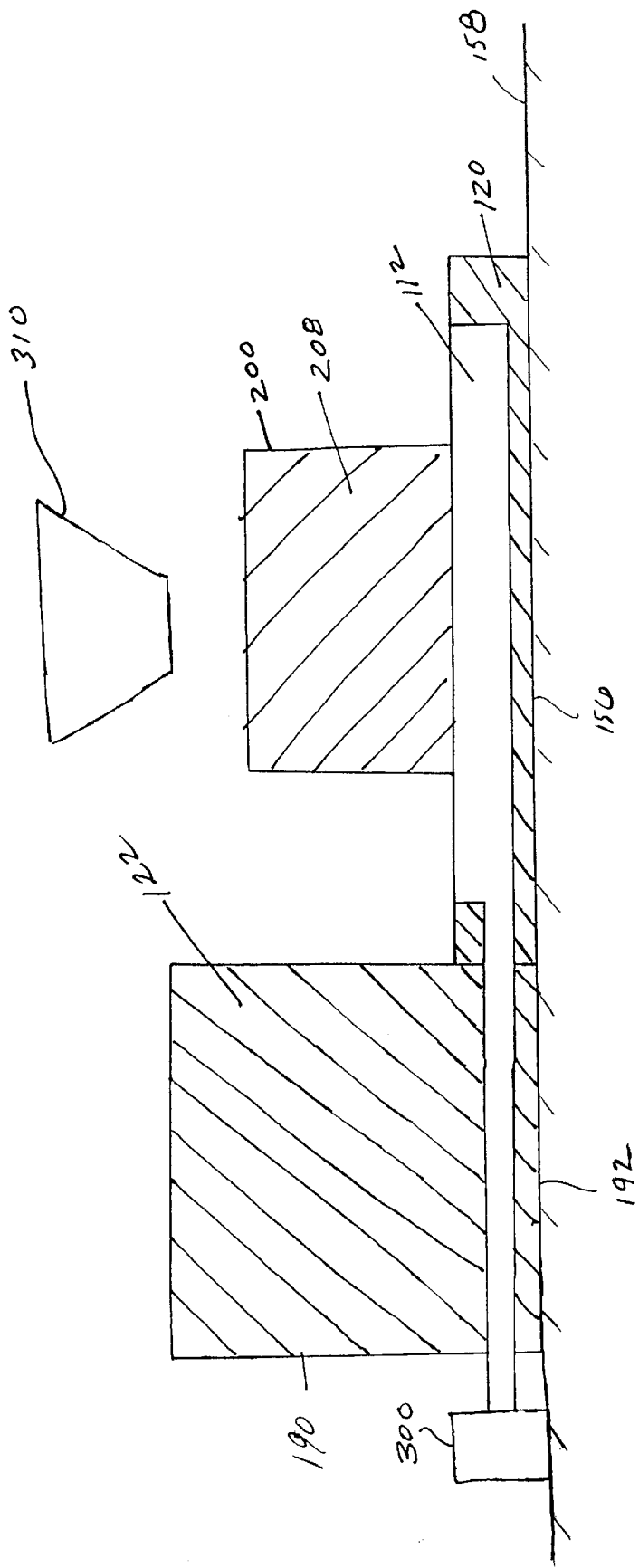
FIG. 4 is cross sectional view of the system of FIG. 3, taken along line 4—4.

In the FIG. 1 position, handling block 190 and holding device 110 are attached as one unit, such that rotating the handling block 190 along line 4—4 (FIG. 3) rotates the holding device 110. In operation, a vacuum source 300 (FIG. 4), residing within or external to the handling block 190, provides vacuum suction for the holding device 110 through pick opening 112. A workpiece 200 (FIG. 2), of which four facets or sides 202, 204, 206, 208 are shown in the drawings, is then targeted and sucked in horizontally toward the pick opening 112 on one of the sides. The workpiece 200 may be initially located on a support surface 158 (FIG. 4), in which case the lower surface of workpiece 200, handling block 190 and holding device 110 are all in the same plane, making it easy to engage holding device 110 with a facet of workpiece 200. Additionally, cushioning may be provided on support surface 158 and holding device side 116 to prevent damage to the workpiece 200 in this process.

The width of the pick opening 112 is less than that of the workpiece 200. Moreover, the length of the pick opening 112 is slightly longer then the length of the workpiece 200, thus providing a margin of error in picking the workpiece 200. Furthermore, the width of the holding device 110 may be approximately equal to that of the workpiece 200, so that the top and bottom surface of the workpiece 200 is aligned with the respective top and bottom surface of the holding device 110, with the pick opening 112 centered along the length of the edge of the workpiece 200. When sucked against the pick opening 112, the top of the pick opening 130 and the bottom of the handling block 122 are parallel to each other, such that the large sides of the workpiece 204, 208 are parallel with the top of the pick opening 130 and the bottom of the handling block 122.

Figure 2:
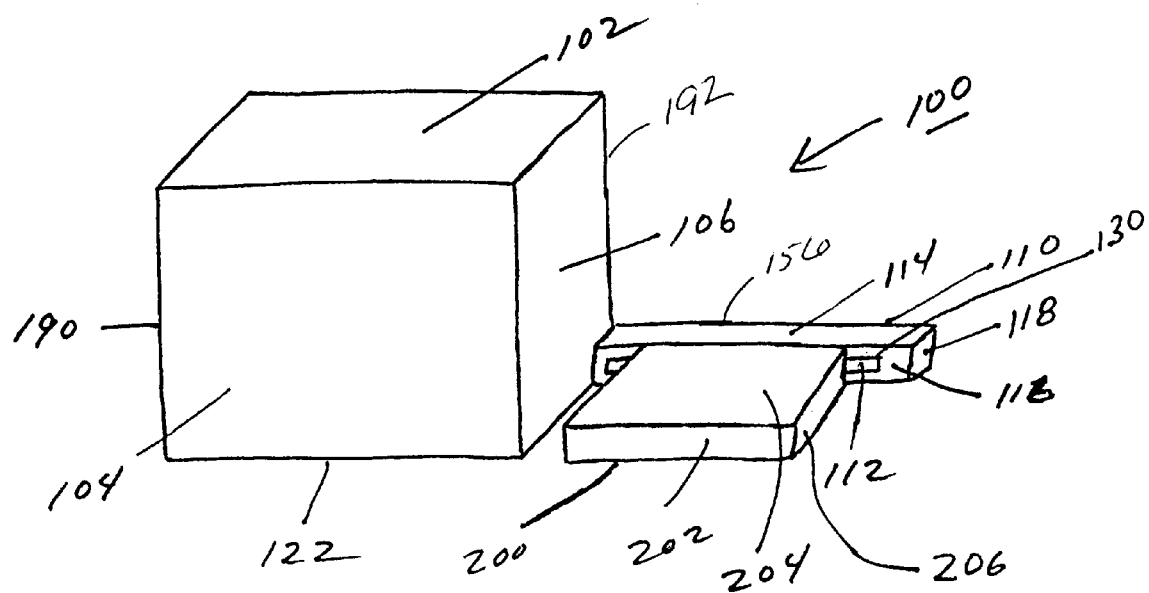
FIG. 2 is a perspective view of the system of FIG. 1, when in use.

After the workpiece 200 is attached and held to the holding device 110 by suction in the position shown in FIG. 2, an operator flips the handling block 190 such that handling block side 104, holding device side 116 and workpiece side 202 are facing up. This can be seen in the FIG. 3 position.

At the conclusion of this handling operation the workpiece facet side 202 has been rotated ninety degrees in an efficient and repeatable manner which does not expose the workpiece 200 to damage. At this point facet 202 may be examined for defects by an inspection apparatus 310. In the inspection position shown in FIG. 4, coplanar control surfaces 192, 156, respectively provided on the handling block 190 and holding device 110, are located on and horizontally supported by the support surface 158. The inspection apparatus 310 may be a microscope or a computerized vision inspection system. The operator may then reverse the process by flipping the handling block 190 and holding device 110 back to the initial position and releasing the vacuum source 300 holding the workpiece 200 to the holding device 110. Next the operator may repeat the process by picking the workpiece 200 on another thin edge to inspect another facet.

The invention should not be limited to the details of the pick equipment 110 and handling block 190 described above. In an alternative embodiment of the invention, for example, the pick opening 112 may be in the form of a plurality of holes, or an adhesive may be used to pick the workpiece 200. In addition, the handling block 190 and holding device 110 may have less than six sides.

The invention may be practiced with a variety of workpieces, including semiconductor chips, laser bars, and semiconductor wafer products and performs, including products with integrated circuits formed therein.

Accordingly, the scope of the present invention is not to be considered as limited by the specifics of the particular structures which have been described and illustrated, but is only limited by the scope of the appended claims.

While certain embodiments of the invention have been described and illustrated above, the invention is not limited to these specific embodiments as numerous modifications, changes and substitutions of equivalent elements can be made without departing form the spirit and scope of the invention.

What is claimed as new and desired to be protected by letters patent of the United States is:

1. A method of inspecting a first edge on a workpiece, said method comprising:
   attaching a second edge of said workpiece to a holding device, said holding device being attached to a handling block; and
   while said second edge of said workpiece is attached to said holding device, manipulating said holding device by rotating said handling block to a point where said first edge of said workpiece is perpendicular to an inspection apparatus.

2. A method of inspecting a facet on a workpiece, said method comprising:
   placing a workpiece on a support surface;
   horizontally attaching said workpiece to a holding device attached to at least two control surfaces; and
   while said workpiece is attached to said holding device, applying force to at least one control surface such that said holding device rotates to a point where said facet of said workpiece is perpendicular to an axis of an inspection apparatus.

3. The method of claim 2, further comprising applying force to at least one control surface such that said holding device rotates to a position where said workpiece is back on said support surface.

4. The method of claim 1, wherein said step of manipulating said holding device includes the step of manually rotating said handling block to said point where said first edge of said workpiece is perpendicular to said inspection apparatus.

5. The method of claim 2, wherein said step of attaching said workpiece to a holding device includes the step of applying suction to a facet of a semiconductor product.

* * * * *